US009910086B2

(12) United States Patent
Czamara et al.

(10) Patent No.: US 9,910,086 B2
(45) Date of Patent: Mar. 6, 2018

(54) TEST IP-BASED A.T.E. INSTRUMENT ARCHITECTURE

(71) Applicants: Allen Czamara, Auburn, MA (US); Ed Paulsen, Medway, MA (US); Lev Alperovich, Lexington, MA (US)

(72) Inventors: Allen Czamara, Auburn, MA (US); Ed Paulsen, Medway, MA (US); Lev Alperovich, Lexington, MA (US)

( * ) Notice: Subject to any disclaimer, the term of this patent is extended or adjusted under 35 U.S.C. 154(b) by 50 days.

(21) Appl. No.: 15/008,594

(22) Filed: Jan. 28, 2016

(65) Prior Publication Data

US 2016/0238657 A1    Aug. 18, 2016

Related U.S. Application Data

(63) Continuation-in-part of application No. 13/742,589, filed on Jan. 16, 2013, now abandoned.
(Continued)

(51) Int. Cl.
*G06F 11/00* (2006.01)
*G01R 31/28* (2006.01)
(Continued)

(52) U.S. Cl.
CPC ... *G01R 31/2834* (2013.01); *G01R 31/31907* (2013.01); *G01R 31/31704* (2013.01); *G01R 31/31705* (2013.01); *G01R 31/31908* (2013.01)

(58) Field of Classification Search
CPC .......... G01R 31/2834; G01R 31/31907; G01R 31/31705; G01R 31/31704; G01R 31/31908
See application file for complete search history.

(56) References Cited

U.S. PATENT DOCUMENTS 4,823,304 A * 4/1989 Frantz ................... G06F 9/4843
                                                        709/232
5,067,104 A * 11/1991 Krishnakumar ...... G06F 13/387
                                                        370/394
(Continued)

OTHER PUBLICATIONS

Accellera, Standard Co-Emulation Modeling Interface (SCE-MI) Reference Manual, Version 1.1.0, Jan. 13, 2005,Accellera, Napa, CA.

*Primary Examiner* — Thien D Nguyen
(74) *Attorney, Agent, or Firm* — Thomas A. O'Rourke; Bodner & O'Rourke, LLP

(57) ABSTRACT

A test system based on multiple instances of reconfigurable instrument IP specifically matched to the device under test may be used in integrating automated testing of semiconductor devices between pre-silicon simulation, post-silicon validation, and production test phases, in one embodiment of software and hardware across all three phases, for different devices. The reconfigurable test system comprises: a tester instrument, instances of instrument IP instantiated in the tester instruments, a computer system, and a test program. The tester instrument connects to a device under test (DUT), and includes FPGAs reconfigurable for the three testing phases. The computer system has a user interface, and a controller connected to the reconfigurable tester instrument via a data bus. The test program stored on the controller, and the controller, instantiates interfaces and protocols, and certain process transactions to support the protocols, into FPGAs, to match device interfaces for each DUT, to execute test sequences.

7 Claims, 16 Drawing Sheets

Related U.S. Application Data

(60) Provisional application No. 61/587,322, filed on Jan. 17, 2012.

(51) Int. Cl.
 *G01R 31/319* (2006.01)
 *G01R 31/317* (2006.01)

(56) References Cited

U.S. PATENT DOCUMENTS

| | | |
|---|---|---|
| 5,212,443 A | 5/1993 | West et al. |
| 5,225,772 A | 7/1993 | Cheung |
| 5,235,271 A | 8/1993 | Kira |
| 5,737,512 A | 4/1998 | Proudfoot |
| 6,661,248 B2 | 3/2003 | Mori et al. |
| 6,900,627 B2 | 5/2005 | Mori et al. |
| 7,058,865 B2 | 6/2006 | Mori et al. |
| 7,126,820 B2 | 10/2006 | Wei |
| 7,152,027 B2 | 12/2006 | Andrade et al. |
| 7,428,680 B2 | 9/2008 | Mukherjee |
| 7,620,862 B1 | 11/2009 | Lai |
| 7,706,259 B2 | 4/2010 | Kim |
| 7,924,043 B2 | 4/2011 | Schroth |
| 7,944,225 B2 | 5/2011 | Kemmerling |
| 8,065,663 B2 | 11/2011 | Blancha |
| 8,195,419 B2 | 6/2012 | Connor |
| 8,269,520 B2 | 9/2012 | Connor |
| 8,347,153 B2 | 1/2013 | Krepner |
| 8,473,275 B2 | 6/2013 | Bartz et al. |
| 8,514,919 B2 | 8/2013 | Estrada et al. |
| 8,725,489 B2 | 5/2014 | Conner |
| 8,805,636 B2 | 8/2014 | Conner |
| 2002/0073374 A1 | 6/2002 | Danialy |
| 2003/0048112 A1* | 3/2003 | Mori ............... G01R 31/31905 324/762.02 |
| 2004/0162694 A1 | 8/2004 | Ricca |
| 2009/0077541 A1* | 3/2009 | Jeffries ............... G06F 11/263 717/127 |
| 2009/0089623 A1 | 4/2009 | Neering et al. |
| 2010/0023294 A1* | 1/2010 | Fan .................. G01R 31/2834 702/123 |
| 2010/0052724 A1 | 3/2010 | Mizuna |
| 2010/0057405 A1 | 3/2010 | Wu |
| 2010/0312516 A1* | 12/2010 | Conner .............. G06F 11/2733 702/117 |
| 2010/0313071 A1 | 12/2010 | Conner |
| 2011/0148456 A1 | 6/2011 | Mooyman-Beck |
| 2011/0202799 A1 | 8/2011 | Pagani |
| 2011/0276302 A1 | 11/2011 | Rivoir |
| 2011/0313089 A1 | 12/2011 | Rajski |
| 2012/0020397 A1* | 1/2012 | Estrada ............... G01R 19/2516 375/224 |
| 2012/0143583 A1* | 6/2012 | Huang ............... G06F 17/5027 703/14 |
| 2013/0227367 A1* | 8/2013 | Czamara ............ G01R 31/3177 714/735 |

\* cited by examiner

TEST IP-BASED A.T.E. INSTRUMENT ARCHITECTURE

CROSS REFERENCES TO RELATED APPLICATIONS

This application is a continuation-in-part of U.S. application Ser. No. 13/742,589, filed on Jan. 16, 2013, which claims priority on U.S. Provisional Application Ser. No. 61/587,322, filed on Jan. 17, 2012, all disclosures of which are incorporated herein by reference.

FIELD OF THE INVENTION

The present invention relates to improvements in the architecture governing automatic test equipment, and more particularly to providing increased versatility and capability over fixed architecture instruments used in the testing of semiconductors.

BACKGROUND OF THE INVENTION

Semiconductor devices manufactured as integrated circuits may consist of billions of devices, including transistors, diodes, passives, MEMs, and other structures being built in and over a substrate that is typically a silicon wafer, which may undergo multiple microfabrication process steps, including doping, ion implantation, etching, deposition of various materials, and photolithographic patterning. The pin count of very large scale integration (VLSI) circuits has grown steadily, and as the designs of semiconductor devices increase in complexity and diversity, more advanced test systems are needed.

Testing of semiconductor integrated circuits may occur through the simulation of complex ICs, through testing that forms an integral part of post-silicon validation of prototype and/or pre-production ICs, as well as through the testing that forms an integral part of its manufacturing process. Testing throughout post-silicon validation is focused on insuring the IC performs per its various specified functional features and specified performance characteristics. Testing throughout manufacture may include a pre-processing step of testing the wafer during fabrication, which is commonly referred to as Wafer Testing and Electronic Die Sort testing, and which may occur on a lot by lot basis. Product testing of the completed semiconductor devices may also occur on a lot by lot basis, as well as some random sampling testing to determine quality.

Automatic Test Equipment (ATE) is therefore heavily utilized in the semiconductor industry to verify functionality, performance, or find faults before that integrated circuit—the Device Under Test (DUT)—is actually utilized in an electronic end-product. The testing of semiconductors utilizing ATE is known in the art (see e.g., U.S. Pat. No. 5,225,772 to Cheung; U.S. Pat. No. 5,235,271 to Kira; and U.S. Pat. No. 5,737,512 to Proudfoot, with the disclosures of each being incorporated herein by reference). Usage of ATE for testing semiconductors may be accomplished through the use of a "tester" that is coupled to the pins of the DUT, and which operates in accordance with specialized test programs that are prepared for specific device types. Circuits within the tester equipment serve as an interface between the DUT and a computer system that is controlling the tests and testing system. Stimuli signals in the form of digital, analog, or RF are thereby input to the pins of the DUT from the tester using drivers associated with each interface circuit. The interface circuits of the tester similarly receive output signals from the DUT pins which processes & compares the signals actually received from the DUT with an expected response that is stored in the computer system. The ATE for the testing of semiconductor devices may also comprise the use of a DUT loadboard. The loadboard may provide an arranged series of sockets or probes for receiving one or more devices on one side of the board, while printed circuits on the other side may serve for mapping and/or conditioning of the contacts corresponding to the pins of the DUT(s). The loadboard will ordinarily be customized for testing of a specific integrated circuit design type.

In order to perform checks of complex semiconductor devices, the computer systems of such automated testing equipment must generally produce testing steps in a deterministic way and execute those testing steps to achieve reliable evaluations of the specific functionality/performance of the particular device. This imposes limitations, in terms of the hardware design, software design, maintenance costs, etc., whereby operations are inefficient and do not effectively match how the various DUT interfaces are intended to operate. The present invention serves to diversify operability of legacy, fixed architecture instrumentation, whereby operations are effectively matched to the various DUT interfaces. The present invention also serves to seamlessly integrate testing of a DUT between pre-silicon simulation, post-silicon validation, and production test phases whereby, in one embodiment the same software and hardware can be used across all three phases.

The advantages of the present invention are not taught or suggested by the prior art. For example, U.S. Patent Application No. 2010-0052754 by Mizuno teaches a circuit to cost effectively expand the number of a legacy fixed architecture digital channels on a low pin count test system using a fan out/fan in approach. The instrument is still a legacy fixed instrument architecture that is cycle & time set based, with no native links to the design environment.

U.S. Pat. No. 7,944,225 Kemmerling: this is another circuit to cost effectively expand the number of a legacy fixed architecture digital channels on a low pin count test system using a fan out/fan in approach. The instrument is still a legacy fixed instrument architecture that is cycle & time set based with no native links to the design environment.

U.S. Pat. No. 5,225,772 to Cheung teaches an enhancement to a legacy fixed architecture digital instrument to provide more per-pin flexibility. The instrument is still a legacy fixed instrument architecture that is cycle & time set based with no native links to the design environment.

U.S. Pat. No. 5,235,271 to Kira teaches a method to use data collected from wafer sort testing to optimize the test list for final (package) testing by switching off tests at final that are statistically in control at wafer test. This is a methodology that is independent of the tester architecture.

U.S. Pat. No. 5,737,512 to Proudfoot teaches an enhancement to a legacy fixed architecture digital instrument to provide faster loading of the cycle based data into the instrument memory from the external tester computer. The instrument is still a legacy fixed instrument architecture that is cycle & time set based with no native links to the design environment.

U.S. Pat. No. 7,924,043 to Schroth teaches an enhancement to a legacy fixed architecture digital instrument to provide signal pre-compensation to account for distortions in the signal path to the device. The instrument is still a legacy fixed instrument architecture that is cycle & time set based with no native links to the design environment.

U.S. Pat. No. 7,428,680 to Mukherjee teaches a circuit that is incorporated into the IC itself specifically for use in testing the internal memories in the IC using different algorithms. This internal built in test circuit (BIST) is unrelated to the external tester architecture.

U.S. Pat. No. 7,620,862 to Lai teaches an enhancement to a legacy fixed architecture digital instrument to multiply the data rate of the tester and effectively create higher speed patterns at the device pin. The tester instrument is nonetheless a legacy fixed instrument architecture that is cycle & time set based, with no native links to the design environment.

U.S. Patent Application No. 2004-0162694 by Ricca teaches a highly specific enhancement to a fixed architecture waveform synthesizer/digitizer which can be set to several specific modes (LF synth, HF synth, LF dig, HF dig). The implementation is quite specific. They do load the FPGA in one of 2 modes—synth or dig. It is not reconfigurable to the extent proposed herein—which may be considered as 4 fixed architecture instruments on one card. In Ricca, here is also no native link to the design environment claimed.

U.S. Pat. No. 8,065,663 to Blancha teaches a software architecture that has a few attributes. First, it provides deterministic execution times. Second, it provides a method to enhance instrument software while preserving previous behaviors to assure back compatibility. Third, it provide a software layering approach that enables high level interfaces to be translated to different implementations of fixed instrument architectures. However, the tester instrument is still a legacy fixed instrument architecture that is cycle & time set based with no native links to the design environment.

U.S. Patent Application No. 2011-0202799 to Pagini: this describes a very specific front end extension to a legacy fixed architecture digital instrument to accomplish a couple of things. First, it enables channel fan in/out (few tester pins running at higher frequency are translated to more pins to the DUT running at a lower frequency). Second, it acts as an adapter/translator that enables multiple versions of legacy fixed instrument architectures to test the same device. This front end extension is quite limited in its reconfigurability to register lengths, depths, and communication IF back to the tester. The tester instrument is still a legacy fixed instrument architecture that is cycle & time set based with no native links to the design environment.

The current ATE systems largely utilize digital instruments that are based on the concept of a pattern generator. This pattern generator is a synchronous state machine that pumps out deterministic patterns—sequences of 1's & 0's—to the device and also compares the output of the device to expected data. This pattern generator has very limited algorithmic capability, as these systems were essentially designed for testing of earlier semi-conductor devices, dating back to the use of Intel's x86 processors, having wide synchronous addresses and data busses, and with it is programs in rows of 1's and 0's, where each row has the option of an "op code" which is an assembly code level instruction like a repeat, jump, etc.

Over time devices have evolved to have multiple, completely independent interfaces (USB, HMDI, SCSI, DDR, etc.). These interfaces are generally independent from one another, have complex handshaking algorithms, and can be non-deterministic in their behavior. This makes utilizing of the legacy fixed pattern generator architectures challenging. So, various enhancements in prior art inventions have been made to the pattern generator architecture to give it more flexibility and to try to run them faster, including partitioning them to have multiple pattern generators in a system. And per some of the following patents, like the Connor patents, the enhancements seek to put hooks in to handle the non-deterministic protocols.

U.S. Patent Application Publication No. 2011/0276302 by Rivoir, U.S. Patent Application Publication No. 2010/0313071 by Connor, and U.S. Pat. Nos. 8,269,520 and 8,195,419 to Connor describe an augmentation to a fixed legacy architecture system that would provide a subset of the functionality offered by the present invention. In their design, the existing fixed architecture is used to control the protocol state machine loaded into the FPGA. The Connor inventions address only non-deterministic use cases, and do not disclose implementing an entire and complete protocol specific instrument (disclosed hereinafter as IIP) within the FPGA. In addition these patents and patent application publications do not teach utilization of a common programming environment that spans pre-silicon simulation, post silicon validation, and production test, nor do they capture the non-digital use cases or the verification acceleration use cases.

In U.S. Pat. No. 8,268,520, Connor teaches a mode where there are two pattern generators, one for Tx and one for Rx, and these pattern generators can be coordinated, and can be implemented in FPGAs, which is fairly common today. The programming model is the same—rows of data and optional op codes.

In U.S. Pat. No. 8,195,419, Connor teaches enhancing the pattern generator state machine with circuits that enable the pattern generator to emulate some aspects of some protocols, but still being within the synchronous state machine architecture, and again, with the same programming enhanced with additional op codes that can be used for vector (row of 1's & 0's).

U.S. Patent Application Publication No. 2010/0313071 by Connor teaches using the pattern generator to control circuits that can "simulate" aspects of some protocols to handle non-deterministic modes of the device interface. So the pattern generator becomes more "protocol aware," but with the same programming enhanced with additional op codes that can be used for vector (row of 1's & 0's).

U.S. Patent Application Publication No. 2010/0313089 by Rajski describes a method to transfer patterns from a fixed architecture instrument to the device for scan based structural test using high speed serial interfaces to reduce the number of tester channels required to send & receive the data, which is a highly specific augmentation limited to legacy instruments.

U.S. Patent Application Publication No. 2011/0148456 by Mooyman-Beck describes a method for connecting signal conditioning circuit to the device under test using multi-chip packaging (die-to-die) technologies, which again assumes a legacy architecture test system and simply provides for a new way to connect & condition the DUT pins to the legacy test system.

So in summary, none of the prior art disclosures teach or suggest utilizing tester instrument architecture that is entirely reconfigurable with Test IP natively linked with the design simulation/verification environment, and do not disclose and teach utilization of a common programming environment that spans pre-silicon simulation, post silicon validation, and production testing.

OBJECTS OF THE INVENTION

It is an object of the invention to provide an improved implementation of automatic testing equipment for semiconductor devices.

It is another object of the invention to provide a Test IP (TIP) based ATE instrument architecture that can be instantiated with TIP matched to the specific device interfaces required by a particular device under test.

It is another object of the invention to provide a seamless integration of pre-silicon verification, post-silicon validation, and production test phases of IC testing through the coupling of IC test hardware and software to Electronic Design Automation (EDA) tools and methodologies used in the pre-silicon verification phase of IC testing.

Further objects and advantages of the invention will become apparent from the following description and claims, and from the accompanying drawings.

SUMMARY OF THE INVENTION

The invention relates to testing of semiconductors in their various forms (wafer, packaged, and multi-chip modules). In the current state of the art, Devices Under Test (DUT) require their interfaces to be supplied with the appropriate stimulus, and the actual responses are measured against expected values. The device may have a number of unique interfaces in various forms as required by the end-application of that device. These interfaces vary widely in type (digital, analog, mixed-signal, RF), in speed (DC to Gb/GHz), and in pin count. These interfaces are primarily based on well defined, standards-based interface protocols, as well as typically including non-standards based interface protocols.

Current solutions generally address these requirements with fixed instrument architectures. These fixed instrument architectures provide a predetermined set of low level controls and Application Programming Interfaces (APIs) that can be used to approximate a required protocol. The fixed instrument architectures must be designed to span a wide range of protocols which results in complex, expensive instruments, and systems infrastructure that are unrelated to any protocol. The controls. APIs, and debug tools associated with these fixed architectures are specific to the instrument. This results in a need for design and verification information to be translated, and also required highly specialized knowledge to use the fixed architecture instruments.

The present invention provides an improved implementation of automatic testing equipment for semiconductor devices, by providing a Test IP (TIP) based ATE instrument architecture that can be instantiated with TIP matched to the specific device interfaces required by a particular device under test.

DETAILED DESCRIPTION OF THE INVENTION

The fabrication of semiconductor devices to form the integrated circuits used in modern electronic equipment constitutes a multiple-step process of photolithographic and chemical processing steps, where electronic circuits are created in sequence on a wafer made of a pure semiconducting material. The semiconducting material most often used is silicon. The complete manufacturing process resulting in packaged chips that are ready for shipment generally requires six to eight weeks, and is performed in a specialized facility known as a "fab." During what is referred to as the "pre-silicon" stage of development, engineers work to test the semiconductor device in a virtual environment through the use of sophisticated simulation, emulation, and other formal verification tools. Conversely, "post-silicon" validation testing is performed beginning with a prototype of the semiconductor device—known as "first silicon"—with the device running under the intended real-world conditions. Because a large semiconductor company may spend many millions of dollars creating a new component, where a delay of only a few weeks in delivery to the marketplace can cost tens of millions of dollars, full functionality and perfect compliance of the chip with its specification is crucial. Therefore, leveraging both the pre-silicon verification work and the post-silicon validation is necessary for successful design implementation.

Figure 1:
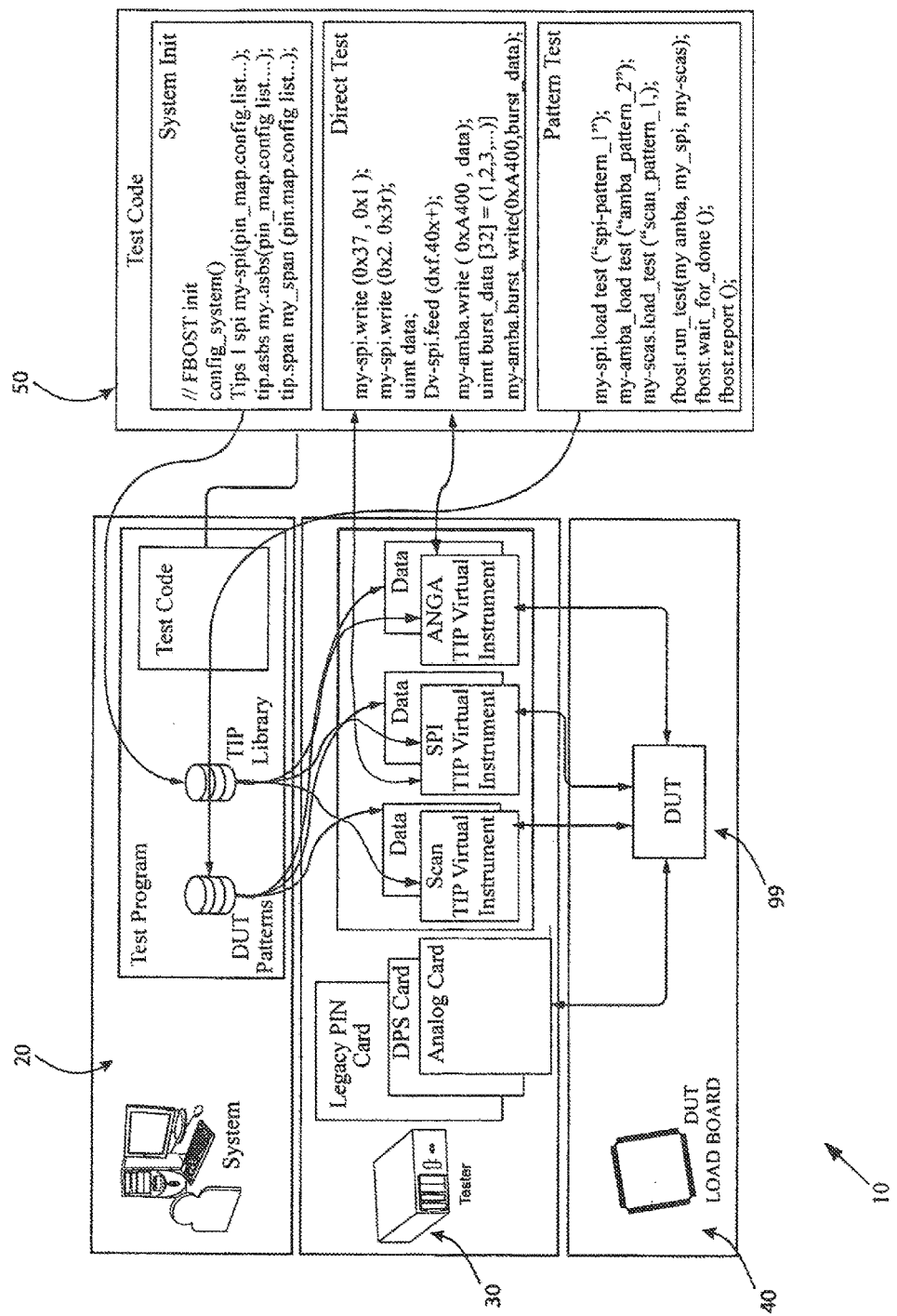
FIG. 1 shows a high level block diagram for an ATE test system in accordance with an embodiment of the present invention.

FIG. 1 shows a high level block diagram for a system 10 permitting automated testing of semiconductor devices, and which is usable in accordance with an embodiment of the present invention. The system 10 may comprise a computer work-station or computer system 20 that may be connected to a tester instrument 30. The computer work station may serve as a user interface and may permit loading of a test program into the tester. The actual test code may be stored in a separate mass storage device 50. The tester 30 may be appropriately connected to a loadboard 40, upon which the Device(s) Under Test (DUT) 99 may be received.

Figure 4:
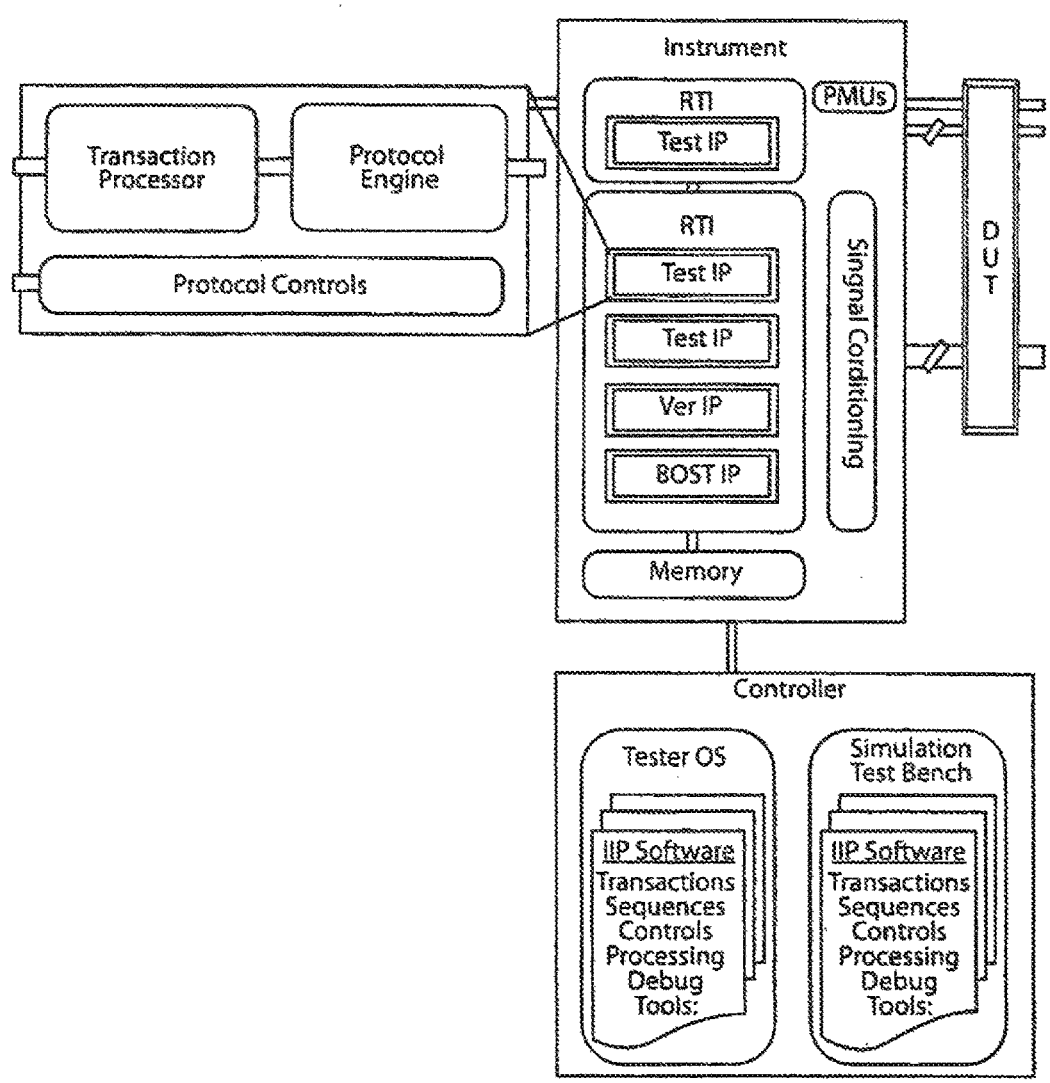
FIG. 4 is a high level block diagram of the Test IP (TIP) based ATE instrument architecture of the present invention.

FIG. 4 is a high level block diagram of the new Test IP (TIP) based ATE instrument architecture. Note that as used herein, "IP" means intellectual property including, but not limited to, interfaces and protocols. For example, Test IP, like Verification IP (VIP), is meant to encapsulate more than just the interface protocol, because the VIP may also include functionality to process transactions to support the protocol, and may transform data received from the protocol engine for compliance testing. TIP may be used in a similar manner, where, for example, data received from an image-based protocol may be processed as part of the TIP to derive a measure of image fidelity. An instrument may consist of Reconfigurable Test Instruments (RTIs) that can be instantiated with TIP matched to the specific device interfaces required by the device under test. Each Test IP instance can contain the required protocol circuit, local processing for load and go operation, and controls to vary the performance and functionality of the TIP. TIP can either connect directly to the device under test or through the appropriate signal conditioning circuits.

The Protocol Engine (see e.g., U.S. Pat. No. 5,067,104 to Krishnakumar, the disclosures of which are incorporated herein by reference) is used to maintain the interface protocol to and from the DUT. This logic will process transactions to and from the Transaction Processor, and will take configuration inputs from the Protocol Controls. The Transaction Processor (see e.g., U.S. Pat. No. 4,823,304 to Frantz, the disclosures of which are incorporated herein by reference) is responsible for general transaction processing, and will take transactions from either external memory—not shown in FIG. 4 but not precluded as part of TIP—the software executive or algorithmically generated internally, process them as needed, and send them to the Protocol Engine. Conversely, transactions that arrive from the Protocol Engine will be processed as needed in the Transaction Processor. For received transactions, possible operations in the Transaction Processor include, depending upon the user mode:

1. The transaction will be stored in external memory or sent to the software executive for later comparison to expected results.

2. The transaction will be compared to expected results—which are either contained in memory or algorithmically generated internally—with debug data sent to memory.

The Protocol Controls block holds configuration information needed to understand the various user modes of a particular TIP type. For example, PCI Express TIP might have configuration modes that tell it the type of speed, number of lanes, and whether it is a root complex or end point. Configuration information can also be used to control timing and voltage levels either outside of, or as part of the Protocol Engine, useful for example for checking DUT physical limits.

As part of the Transaction Processor, synchronization events are used by the various TIP instances and the software executive to craft specific test cases. These test cases will need to know where and when events occur in TIP instances during normal transaction flows within the TIP Tester, and then signal the various TIP instances to do predefined actions based on the conditions at the time. An example would be a case where an Ethernet port of the DUT is shut down from sending data by one TIP instance while another TIP instance continues to feed transactions destined for output by the transmit-disabled port. Once enough traffic is sent to overflow buffers inside the DUT, status of the event can be checked, and then the disabled port can be enabled for reception again. The coordination of this sequence will use synchronization events, similar to what's used in pre-silicon verification.

Transaction and event logging is used to save time-stamped transactions of pin-level detail into and out of the DUT, and store these in external memory, for example. This information is used in a waveform debug tool to help users debug test cases and DUT errors, similar to what's done in pre-silicon verification. A high-level transaction capture mode, and a detailed pin-level mode can be supported by TIP. Transaction flows can be used as a "broad brush" to figure out problem timeframes of a test. Then, if more detail is needed, the pin mode can be used for selected TIP instances. Note that captured transactions, both into and out of the DUT, are useful for later post-processing—for example, implementing a scoreboard similar to pre-silicon verification.

In this example and those examples described below, the term "instantiation" as applied to Test IP is a process whereby a portion of an RTI is configured with the pre-defined functionality of a specific TIP, and specific input and output pins of the protocol engine of the TIP are connected to the DUT pins that match the specific TIP supported protocol. When instantiated in an RTI, the specific TIP can then be used to communicate with the DUT using the specific protocol that is matched between the TIP and the DUT interface. This process is repeated for all the various DUT interfaces, such that each DUT interface has a corresponding TIP attached to it.

Pre-silicon verification tests using Verification IP (VIP) or a subset thereof used in simulation test benches can also be used with corresponding TIP instantiated into the instrument. This enables simulation test bench scenarios to be executed completely or partially in the instrument hardware and with the actual device. Results can be compared and correlated with the simulation test bench during post silicon verification.

Built-off self-test IP (BOST IP or BIP), can also be instantiated into the instrument. BOST is an extension of the internal Built In Self Test capability incorporated into the device itself to enhance testability. BOST IP provides additional gates off chip to enhance the BIST functionality without increasing silicon size.

The reconfigurable instrument TIP and BIP (collectively referred to as Instrument IP or IIP) are connected to a controller via a data bus. The software on the controller is used to instantiate the IIP into the instrument for each different device interface and execute a sequence of tests utilizing the IP. The programming interfaces and tools for each IP block are specific, and in the language of, that IP block's protocol, transactions, and controls. These programming interfaces and tools can either be incorporated into a tester operating system and/or they can be incorporated into the simulation test bench software.

Figure 5A:
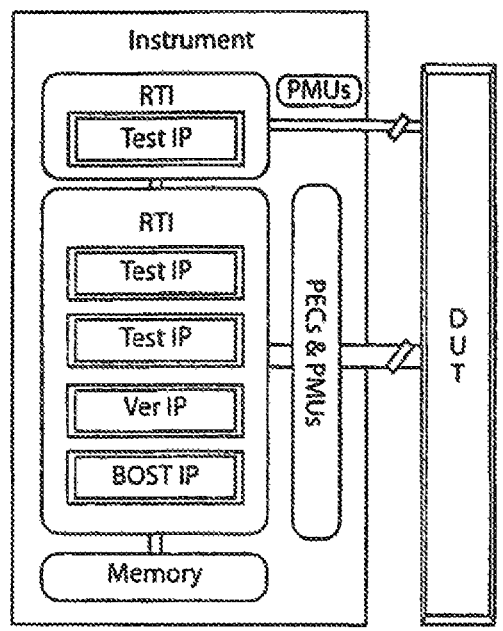
FIG. 5A shows a digital implementation of the IP based instrument concept of the present invention.

FIG. 5A shows a digital implementation of the IP based instrument concept. Various RTIs can be incorporated based on the pin count and performance requirements. Additional source/measurement capabilities such as parametric measurement units can be added to augment the instrument functionality. RTI pins can either be brought to the device interface directly or through digital pin electronic circuits (PEC) to provide additional signal conditioning and control.

Figure 5B:
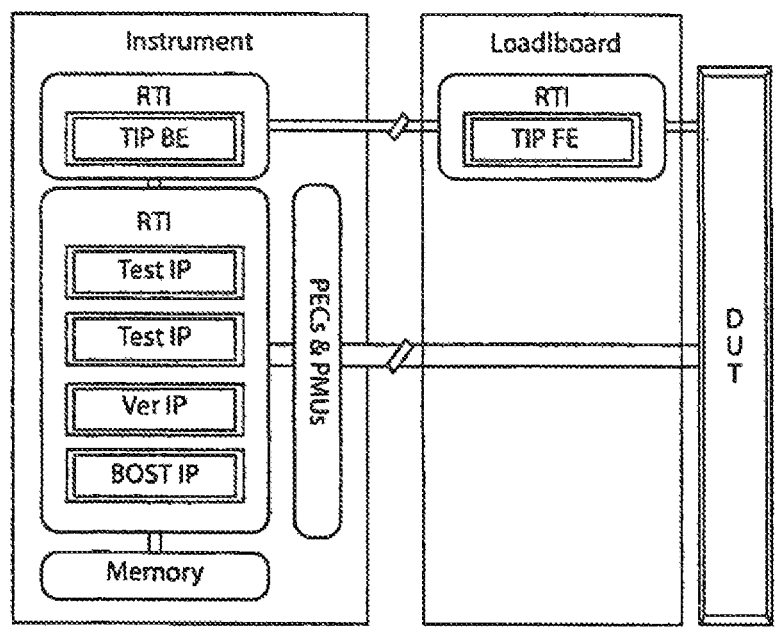
FIG. 5B shows an IP based instrument with the front end of an TIP block placed remotely from the instrument card.

FIG. 5B shows an IP based instrument with the front end of a TIP block placed remotely from the instrument card to achieve closer proximity to the DUT on the DUT specific loadboard or Probe card. This implementation provides improved signal delivery and lower latency performance for a specific IP implementation. The TIP back end (BE) and TIP front end (FE) as shown in this example would be controlled holistically by the IP software as one TIP functional block. This implementation is useful for any type of IIP-digital, mixed-signal, RF, etc.

Figure 6A:
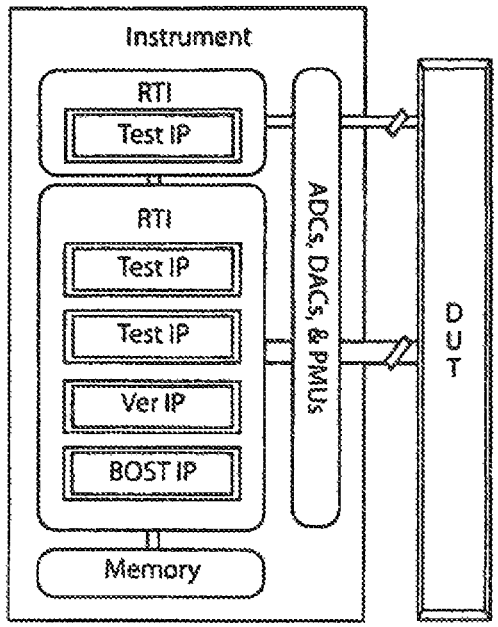
FIG. 6A shows an analog/mixed signal implementation of the IP based instrument concept.

FIG. 6A shows an analog/mixed-signal implementation of the IP based concept. Various RTIs can be incorporated based on the pin count and performance requirements. The rip in the RTI controls digital to analog converters (DACs) and/or analog to digital converters (ADCs), which convert the digital inputs/outputs of the RTIs into the appropriate analog waveforms. Various DACs and ADCs can be used to achieve the required functionality and performance to support the IIP.

Figure 6B:
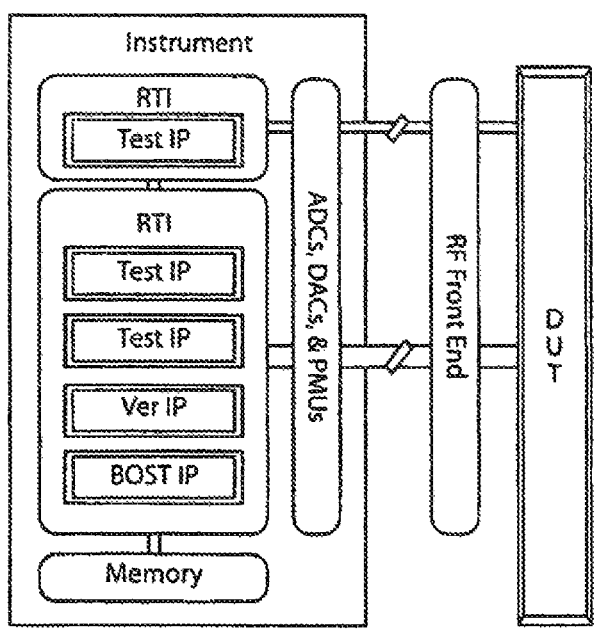
FIG. 6B shows a radio frequency (RF) implementation of the IP based instrument concept.

FIG. 6B shows a radio frequency (RF) implementation of the IP based instrument concept. Various RTIs can be incorporated based on the pin count and performance requirements. The IIP in the RTI controls digital to analog converters (DACs) and/or analog to digital converters (ADCs) which convert the digital inputs/outputs of the RTIs into the appropriate analog waveforms. A combination of digital control signals from the RTI and the analog waveforms from the ADC/DACs control the RF front end to production and measure RF signals. Various DACs, ADCs, and RF Front End circuits can be used to achieve the required functionality and performance to support the IIP.

Figure 7A:
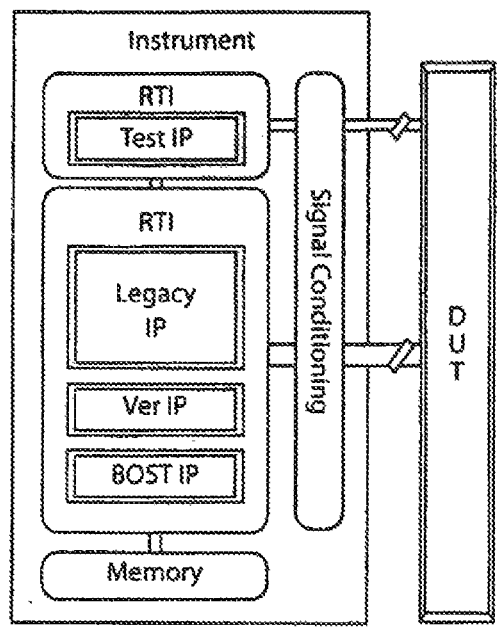
FIG. 7A shows an implementation of IIP that emulates the current functionality of a legacy fixed architecture instrument.

FIG. 7A shows an implementation of IIP that emulates the current functionality of a legacy fixed architecture instrument (Legacy IP). This enable the IP based instrument to be configures as required to mimic the performance and functionality of an existing legacy instrument for back compatibility purposes.

Figure 7B:
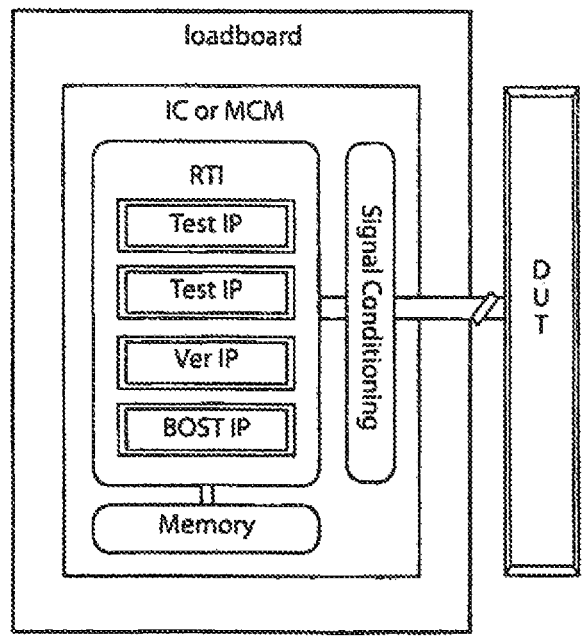
FIG. 7B shows an implementation of an IIP based instrument for a monolithic IC or multi-chip module (MCM).

FIG. 7B shows an implementation of an IIP based instrument implemented as a monolithic IC or multi-chip module (MCM) to achieve a complete instrument or set of instruments in a chip. This enables the IIP test instruments to be reduced in cost and placed in close proximity to the DUT for improved performance. The control and software integration would be similar to that of the IIP instrument on a card.

Figure 8:
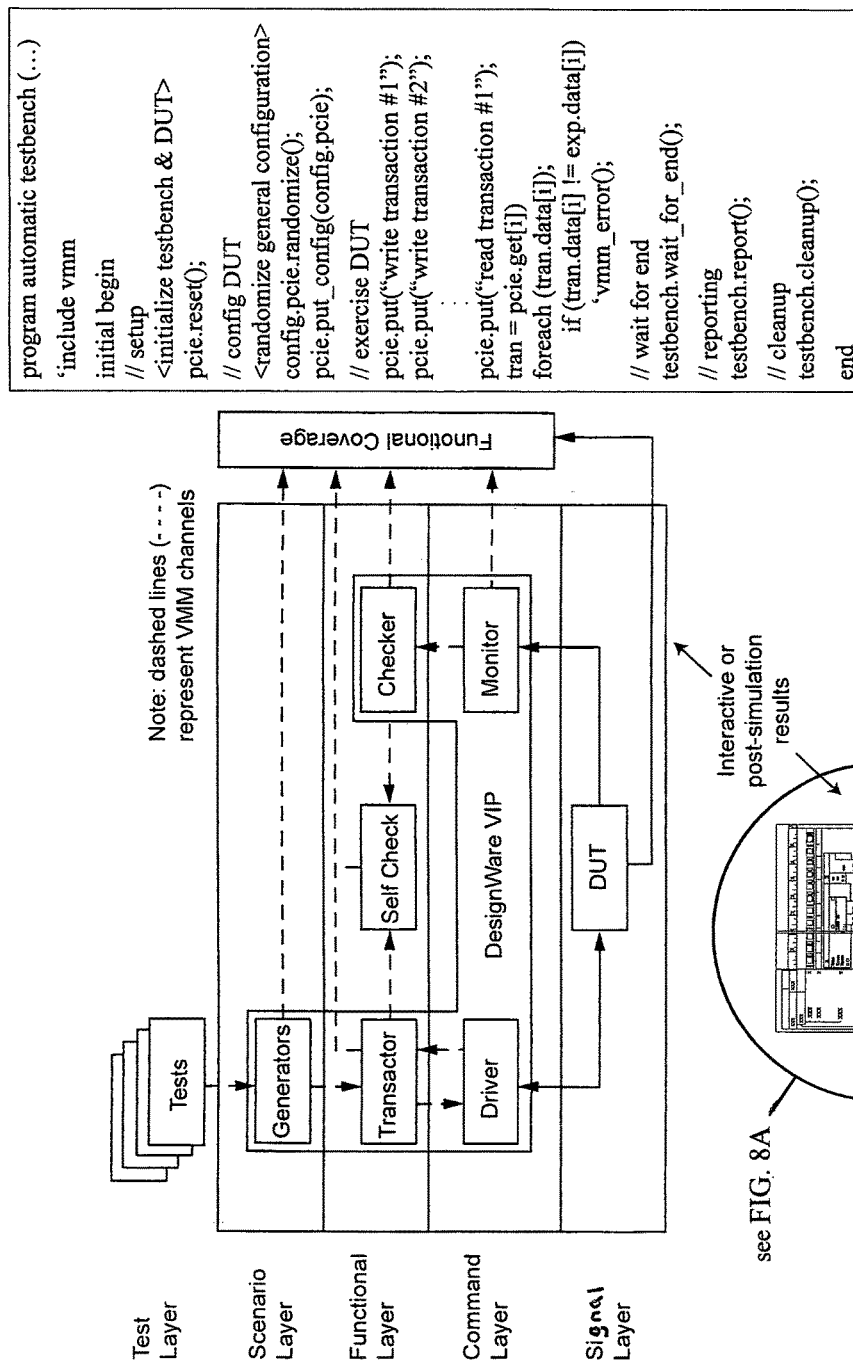
FIG. 8 illustrates the interaction between the Test Layer, Scenario Layer, Functional Layer, Command Layer, and Signal Layer of a test bench in accordance with the current art for pre-silicon simulation of ICs, and also shows the debug tool of the present invention.
Figure 8A:
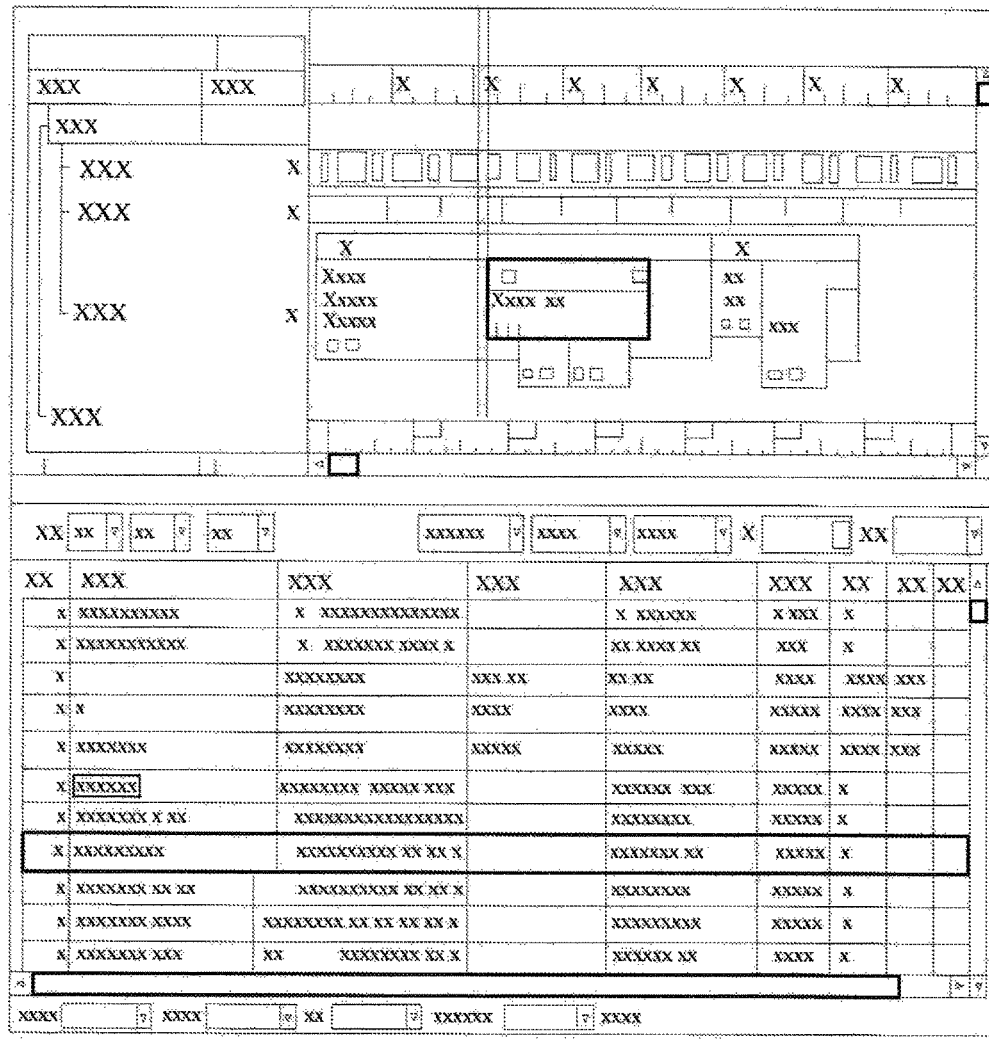
FIG. 8A is an enlarged detail view of the debug tool shown in FIG. 8, with the tool being configured to graphically display the time-stamped transactions of the pin-level detail into and out of the DUT, for each pin of the semiconductor, and to also compare predicted versus actual responses for each of the pins of the DUT in a scoreboard (side-by-side) format, with the pin data being shown generically with X's in FIG. 8A, merely to illustrate the graphical nature of the debug tool.

FIG. 8 shows a layered testbench that is an example of the current art of simulating an IC as part of pre-silicon testing prior to manufacture. Each layer, from Signal up to Test, increases in abstraction. The Signal Layer involves wires leading into and out of the DUT. The Command Layer handles low-level protocol for each specific DUT interface. The Functional Layer drives high-level transactions into the DUT, receives high-level transactions from the DUT, and compares predicted versus actual responses from the DUT. The Scenario Layer handles transaction generation for all the DUT interfaces, both stimulus and expected response. Finally, the Test Layer involves high-level test conditions, strategies, and transaction coordination. Also shown in FIG. 8 is an example simulation test program, highlighting simple protocol writes and reads. Finally, a debug tool as part of an EDA toolkit is shown as part of the debugging process. It's important to note that there are other embodiments of a layered testbench for pre-silicon validation, and the invention is not limited to only this one.

Figure 9A:
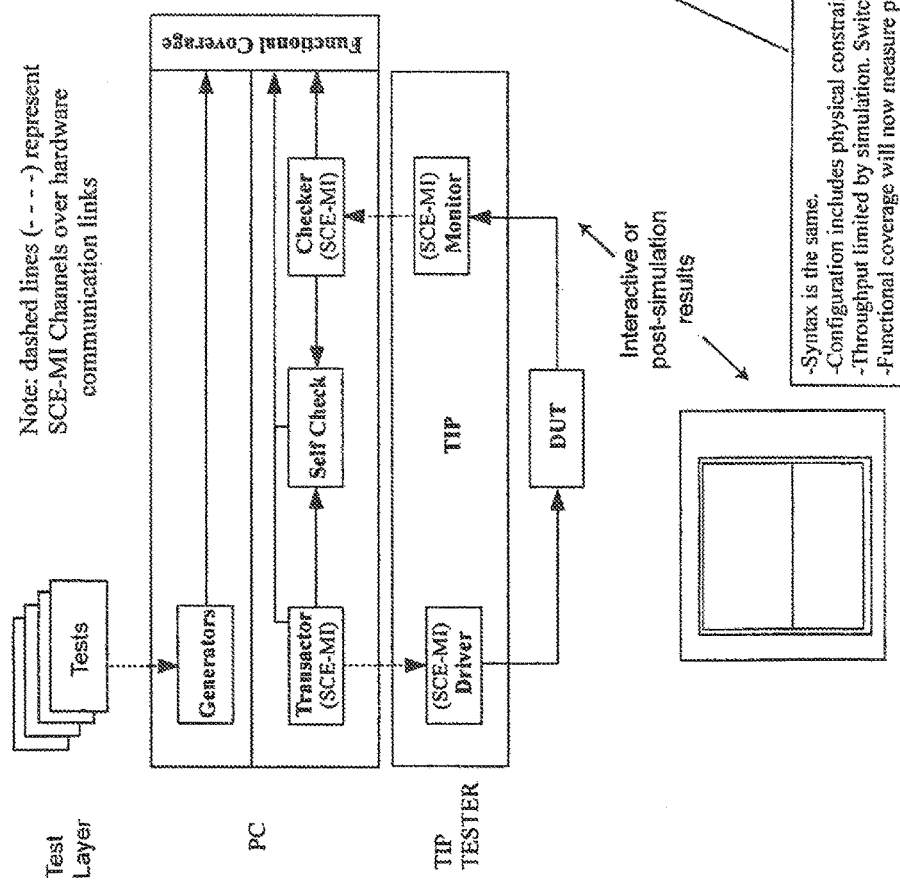
FIG. 9A illustrates a mode of interaction between the Test Layer, Scenario Layer, Functional Layer, Command Layer, and Signal Layer of a test bench in accordance with the present invention applied to pre-production testing.

FIG. 9A shows one embodiment of the invention, where the TIP-based ATE instrument architecture replaces the bottom two layers of the simulation testbench shown in FIG. 8. The top layers of the simulation testbench remain intact, but now communicate with the TIP-based ATE instrument architecture using SCE-MI (Standard Co-Emulation Modeling Interface, a standard by Accellera Systems Initiative) to test the DUT instead of the simulator (see, "Standard Co-Emulation Modeling Interface (SCE-MI) Reference Manual," Version 2.1, Jan. 21, 2011, available at: www.accellera.org/downloads/standards/sce-mi/SCE_MI_v21-110112-final.pdf). In this embodiment of the invention, the example simulation test program from FIG. 9 is exactly the same as that of FIG. 8. Also, the same EDA toolkit is available for debugging. This embodiment of the invention shows seamless integration between simulation and post-silicon validation, whereby the same test code can be used for stimulus and response checking of the DUT. The use of SCE-MI is one method of communicating between the simulator and the TIP-based ATE instrument. The invention does not depend upon the use of SCE-MI, and other embodiments are possible with other methods of simulator to TIP-based ATE instrument communication. Also, it's important to note that there are other embodiments of the invention that are aligned to other layered pre-silicon testbench architectures, and the invention is not limited to only this one embodiment.

Figure 9B:
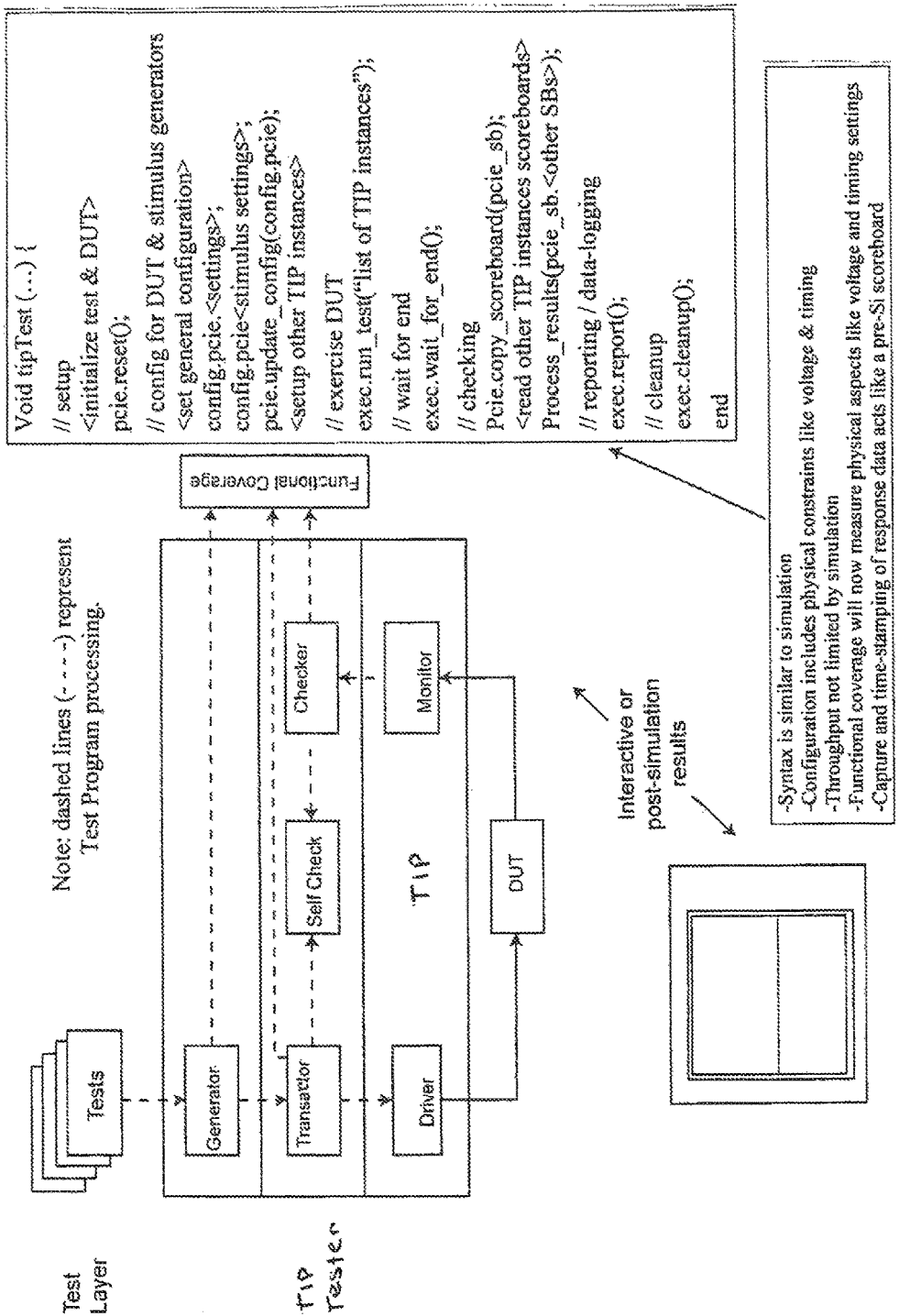
FIG. 9B illustrates a second mode of interaction between the Test Layer, Scenario Layer, Functional Layer, Command Layer, and Signal Layer of a test bench in accordance with the present invention applied to pre-production testing.

FIG. 9B shows a second embodiment of the invention, where the TIP-based ATE instrument architecture replaces all four layers of the simulation testbench shown in FIG. 8. In this embodiment of the invention there is no connection to the simulator. The TIP has native random stimulus generation and response checking. As with the embodiment in FIG. 9A, the same EDA toolkit is available for debugging. This embodiment of the invention shows how the tools and methodology from pre-silicon verification are used for post-silicon validation, whereby similar test code can be used for stimulus and response checking of the DUT. Also, it's important to note that there are other embodiments of the invention that allow mixing of TIP test modes, random stimulus generation and response checking, and pre-defined stimulus and response checking, in the same TIP instance and across TIP instances. The invention is not limited to only this one embodiment.

Figure 10A:
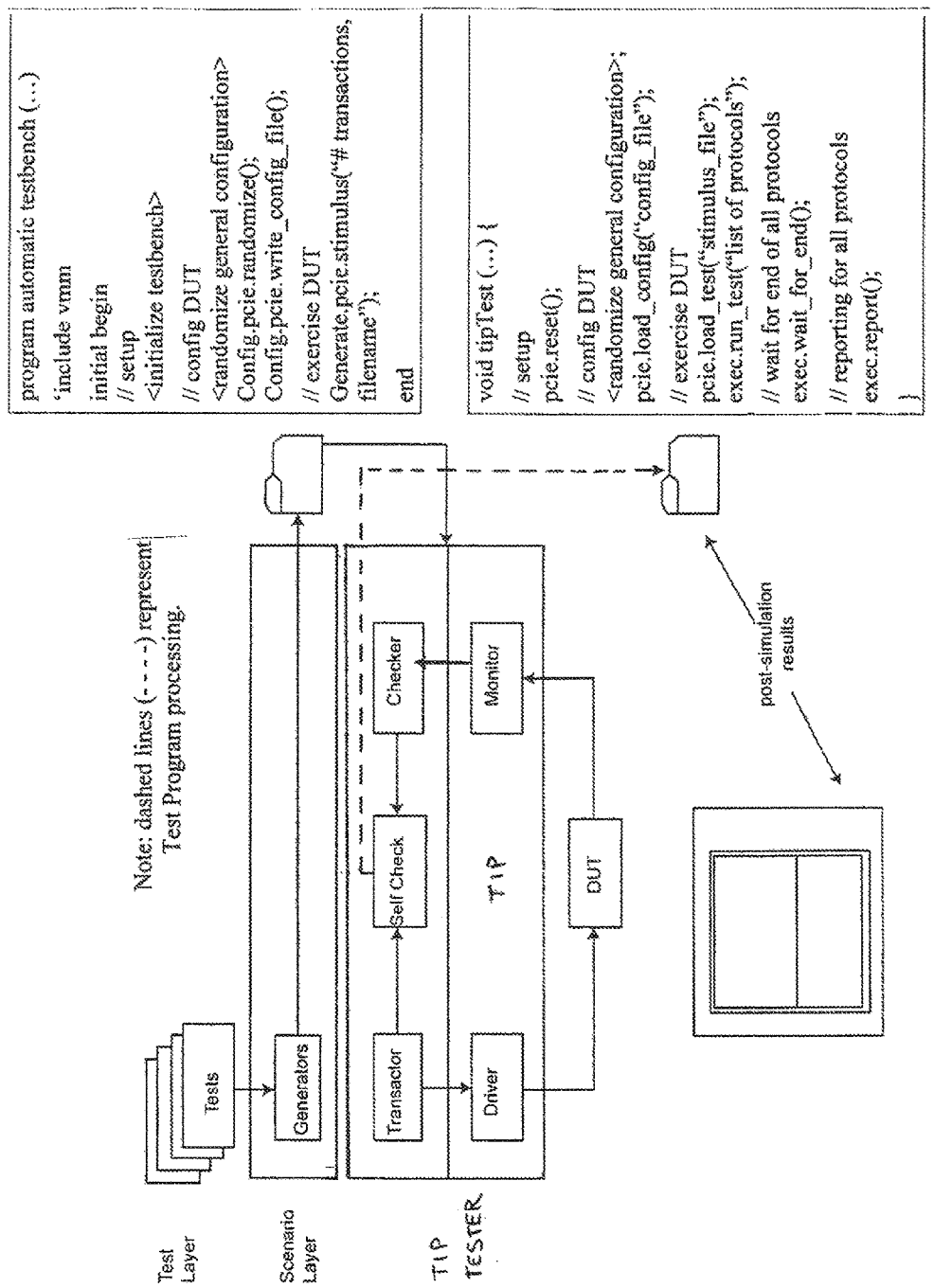
FIG. 10A illustrates a mode of interaction between the Test Layer, Scenario Layer, Functional Layer, Command Layer, and Signal Layer of a test bench in accordance with the present invention applied to production testing.

FIG. 10A shows a third embodiment of the invention, where the TIP-based ATE instrument architecture replaces the bottom three layers of the simulation testbench shown in FIG. 8. In this embodiment of the invention, the example simulation test program from FIG. 8 is used to pre-generate stimulus and response for all DUT interfaces, and write the data to one or more files in a predetermined format. The TIP-based ATE instrument architecture will then read the file or files, loading the specific stimulus and response into each TIP that connects to each DUT interface. This embodiment of the invention illustrates a "load and go" model that leverages the simulation testbench, but doesn't directly connect to it, which is applicable for production testing. Also note that the same EDA toolkit is available for debugging.

Figure 10B:
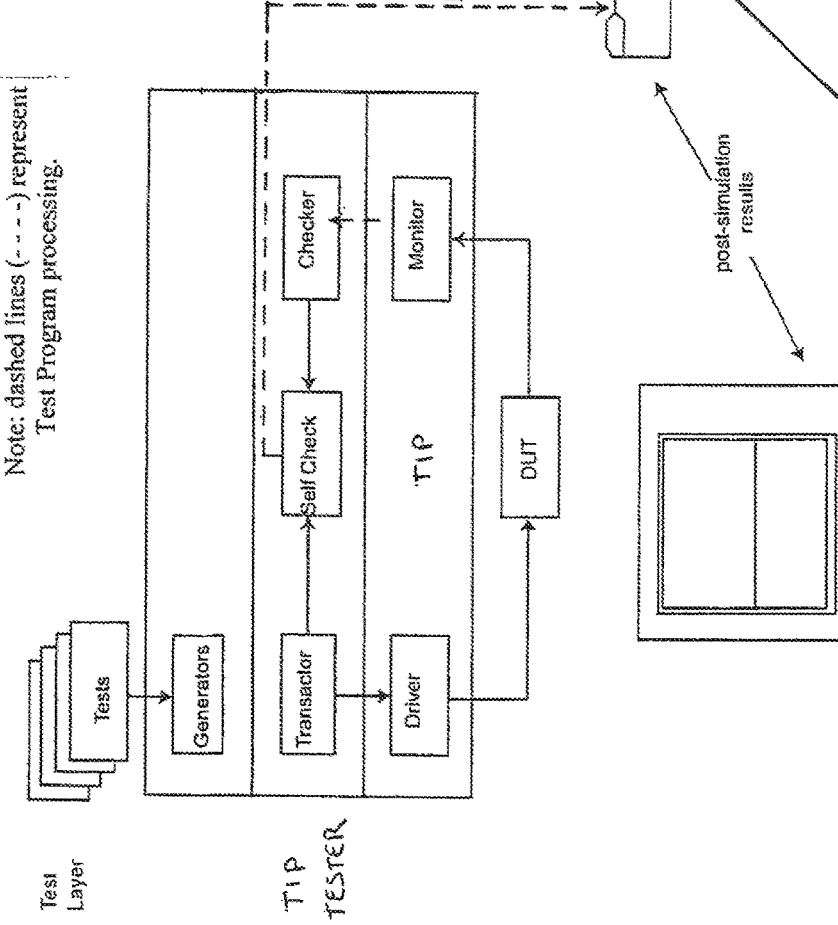
FIG. 10B illustrates a second mode of interaction between the Test Layer, Scenario Layer, Functional Layer, Command Layer, and Signal Layer of a test bench in accordance with the present invention applied to production testing.

FIG. 10B shows a forth embodiment of the invention, where the TIP-based ATE instrument architecture replaces all four layers of the simulation testbench shown in FIG. 8. In this embodiment of the invention, similar to that shown in FIG. 9B, a combination of random and pre-defined stimulus, and random and pre-defined response checking is natively defined in each TIP instance for all DUT interfaces. This embodiment of the invention illustrates a "native mode" model that leverages the pre-silicon methodology and tools, but doesn't directly connect to a simulator, which is applicable for production testing. Also note that the same EDA toolkit is available for debugging.

The seamless integration described above and in FIGS. 9A, 9B, 10A and 10B is advantageous and a key aspect of the invention. The current art does not allow for seamless integration between pre-silicon and post-silicon validation and production test, as the methodologies and tools for these three phases of validation are distinctly different.

In the example embodiments of FIGS. 9A, 9B, 10A and 10B, replacing portions of the layered pre-simulation validation testbench by the TIP-base ATE instrument architecture is required, because in simulation the DUT is virtual, while in post-silicon validation and production the DUT is a real integrated circuit requiring electrical signaling to control its operation and monitor its response to stimulus. Thus one of the keys of the invention is to replace virtual elements with real hardware that can interface with the DUT in a way that allows seamless integration between the various phase of validation and production testing.

Figure 11:
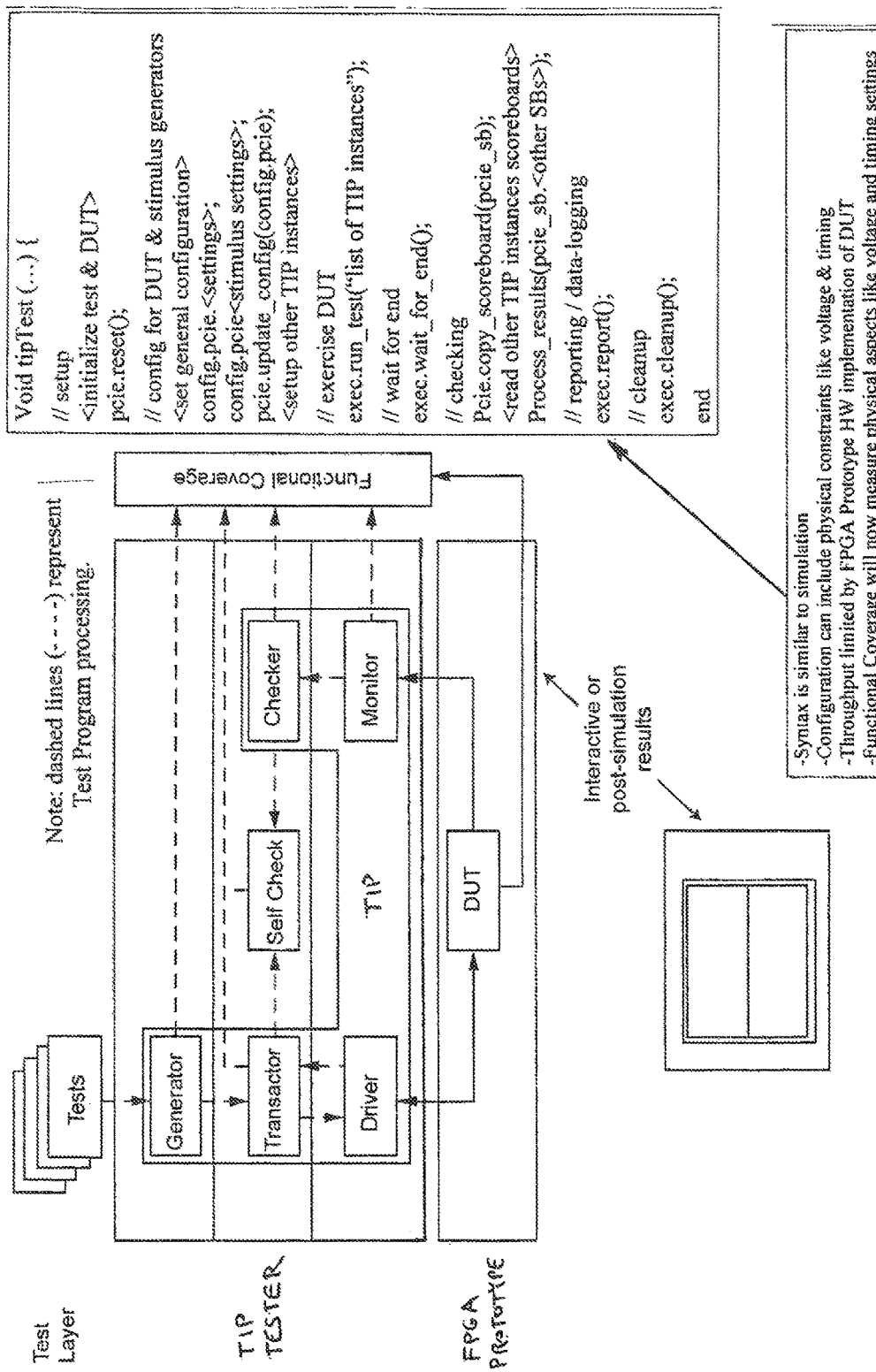
FIG. 11 illustrates a mode of interaction between the Test Layer, Scenario Layer, Functional Layer, Command Layer, and Signal Layer of a test bench in accordance with the present invention applied to pre-silicon testing.
Figure 12:
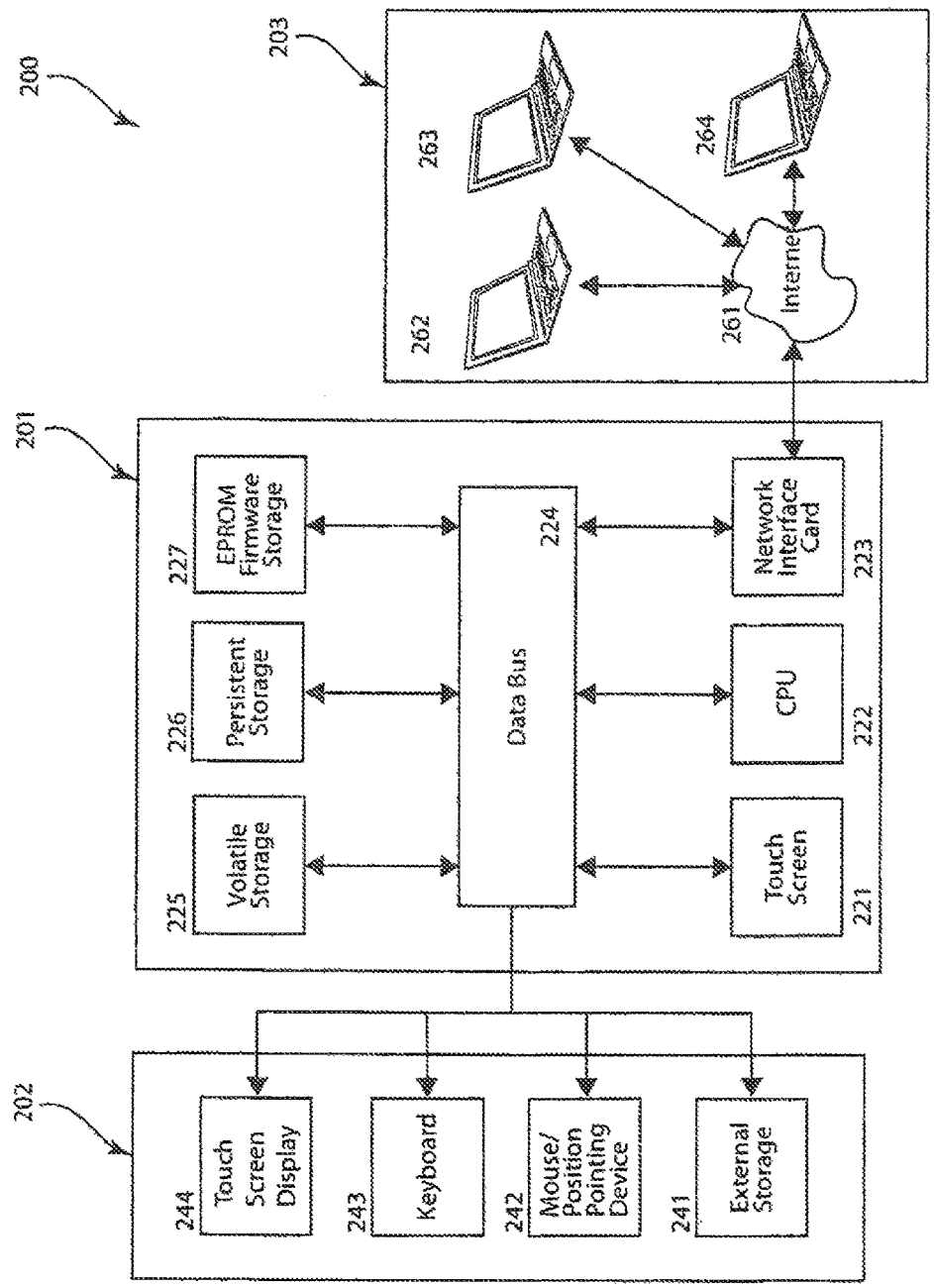
FIG. 12 is a schematic of an exemplary computing unit interacting with external peripherals and other computers over the internet, and being capable of running any software necessary for the implementation of the current invention.

FIG. 11 shows another embodiment of the invention, where the TIP-based ATE instrument architecture replaces the top three layers of the simulation testbench shown in FIG. 8. The bottom layer of the simulation testbench contains an FPGA-based prototyping system, which contains the pre-silicon DUT. In this embodiment of the invention, which is similar to that shown in FIG. 9B, TIP is running without any connection to the simulator, using a combination of random and pre-defined stimulus generation and response checking, that allow relatively fast hardware-assisted pre-silicon verification compared with current state of the art. Also, the same EDA toolkit is available for debugging. This embodiment of the invention shows how TIP can be used for pre-silicon verification, using the same pre-silicon tools and methodology. It's important to note that there are other embodiments of the invention that allow hardware-assisted pre-silicon verification, and the invention is not limited to only this one embodiment.

Figure 2B:
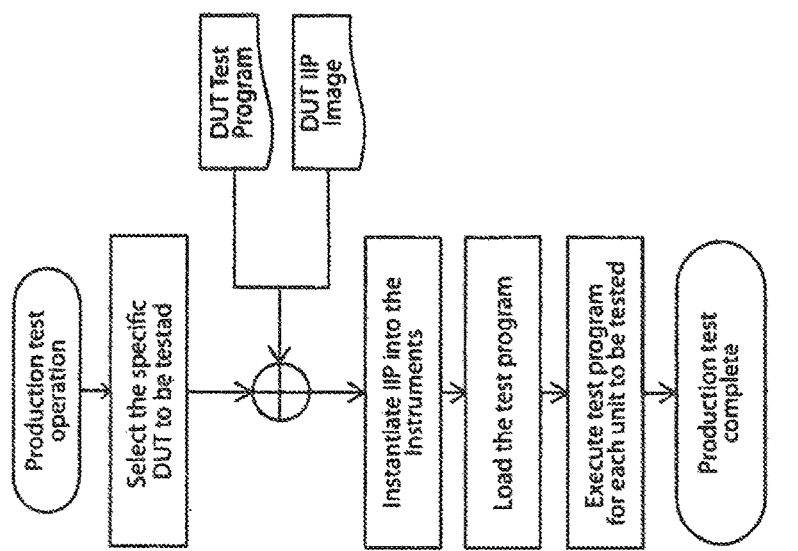
FIG. 2B is a flow chart illustrating the process for production testing using ATE in accordance with an embodiment of the present invention.
Figure 2A:
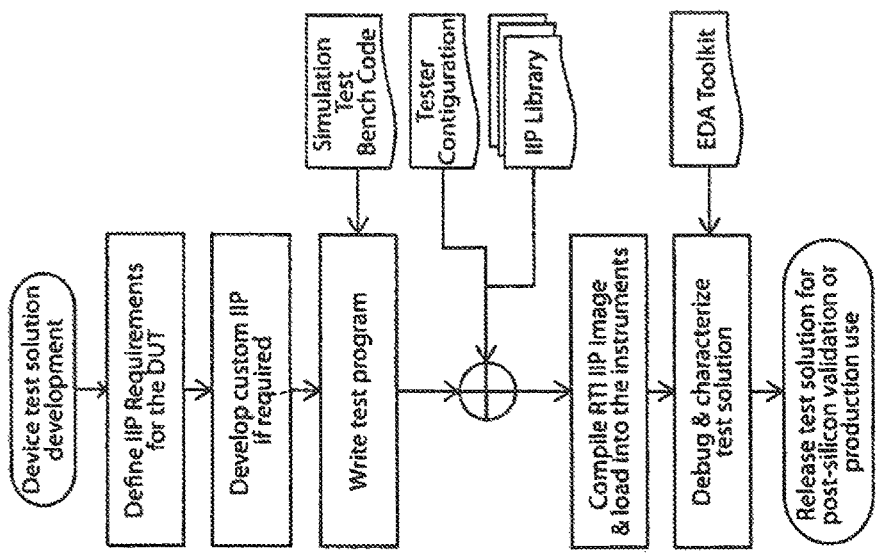
FIG. 2A is a flow chart showing the process for producing a test solution for production testing in accordance with an embodiment of the present invention.

FIG. 2A is a flow chart illustrating the process for creating a test solution for production use. Device test solution development begins by defining IIP requirements for the particular device under test, or for a group of such devices to be analyzed. Custom IIP may be developed, if required, prior to writing a suitable test program for the device or devices under test. The test program may incorporate a simulation test code bench. The written test program may be utilized in conjunction with an appropriate tester configuration and IIP library, and an RTI IIP image may be compiled and loaded into the instruments. The code may then be debugged utilizing an EDA toolkit, and the test solution characterized prior to releasing the test solution for production use.

FIG. 2B is a flow chart illustrating the process for production operational testing using ATE. The selected DUT may be connected to the tester and the test program and the DUT IIP image may be loaded into the system. Next the IIP may be instantiated into the instruments, and the test program may then be executed for each unit on the loadboard that is to be tested, until each of the stimuli have been inputted, and the responses compared with the expected responses to determine functionality and performance.

Figure 2C:
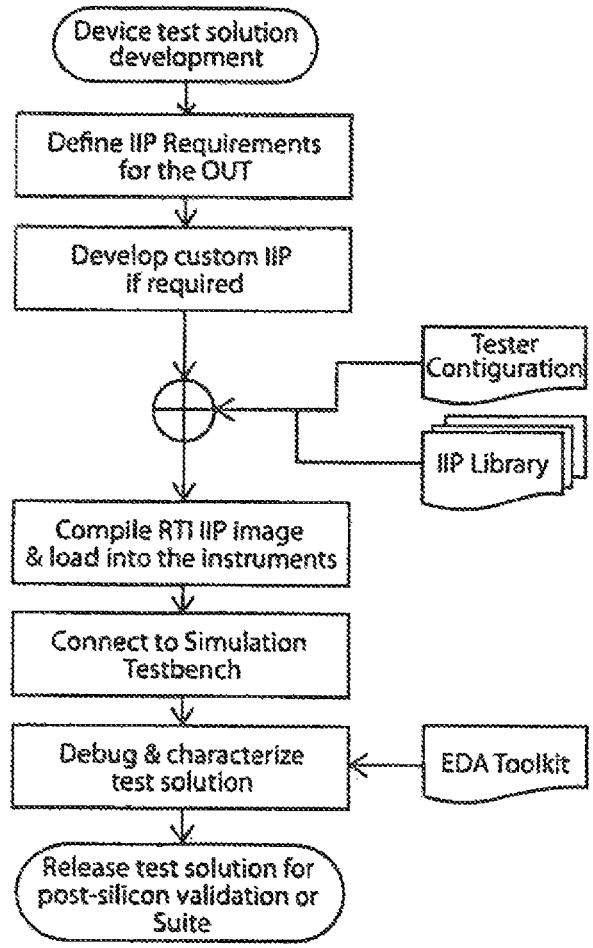
FIG. 2C is a flow chart illustrating the process for creating a test solution for post-silicon validation use.
Figure 3:
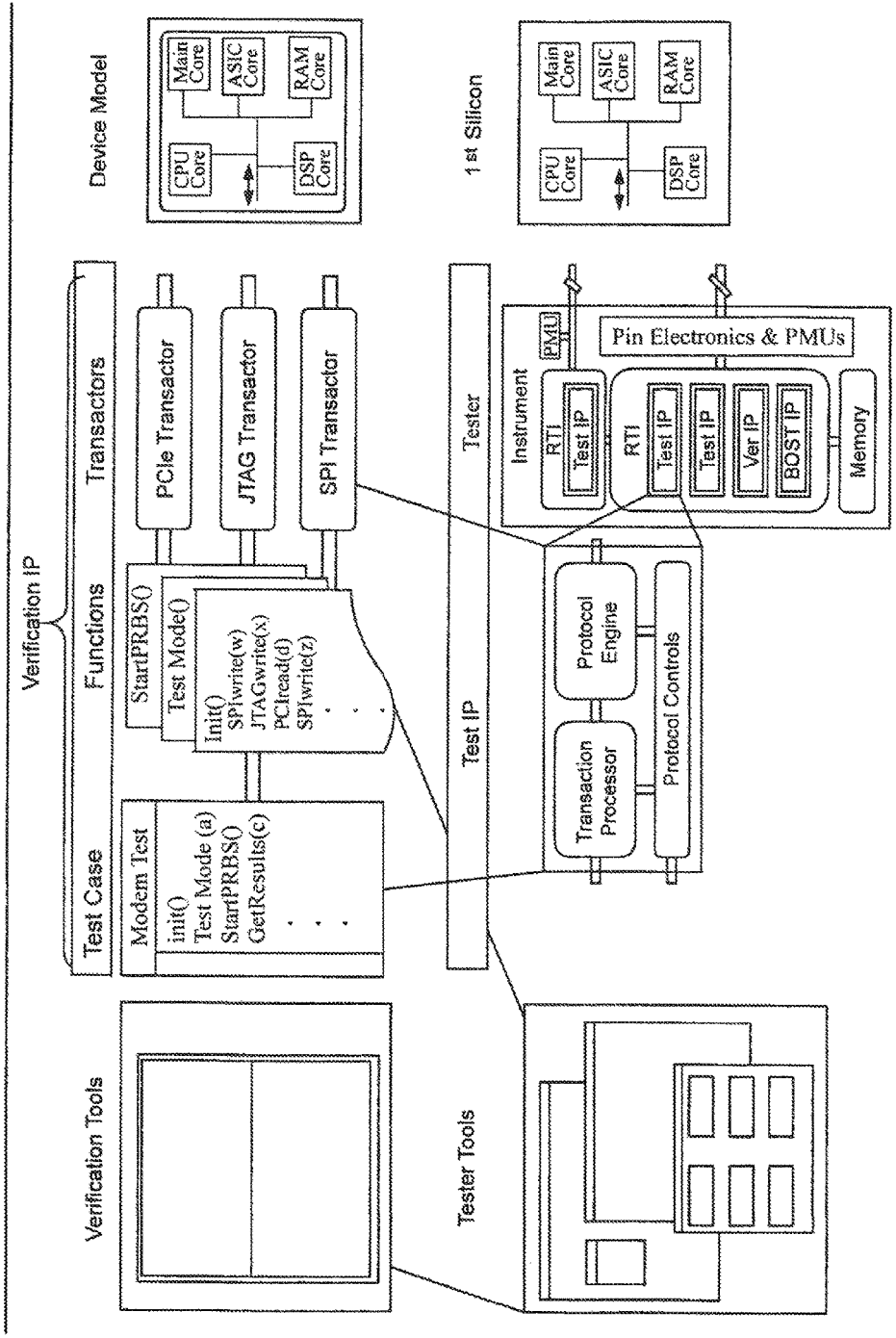
FIG. 3 is a block diagram illustrating the variable architecture of the current invention being aligned to the Verification Environment.

FIG. 2C is a flow chart illustrating the process for creating a test solution for post-silicon validation use. Similar to FIG. 2A, device test solution development begins by defining IIP requirements for the particular device under test, or for a group of such devices to be analyzed. Custom IIP may be developed, if required, prior to writing a suitable test program for the device or devices under test. The appropriate tester configuration and IIP library, and an RTI IIP image may be compiled and loaded into the instruments. Then the TIP-based ATE instrumentation is connected to the simulation, and any pre-silicon test code may then be debugged utilizing an EDA toolkit, and the test solution characterized prior to releasing the test solution for post-silicon validation use. This overall flowchart is an example of using the embodiment of the invention shown in FIG. 9.

Therefore, based on the disclosures hereinabove, at least the following distinctions between the present invention and the prior art serve to provide significant improvements:

1) There is no fixed architecture pattern generator in the solution of the present invention. A Test IP instance of the invention is actually based on the specific protocol IP. It is not protocol "aware." It is the protocol in the same way the peripheral at the other end of your USB cable is when plugged into the device under test. This protocol IP is herein augmented with a transaction processor to control the protocol IP, with protocol controls to vary characteristics of the protocol IP as required for testing, and transaction/event logging to capture activity for debug purposes.

2) The programming model of the current invention does not consist of rows of 1's and 0's with op codes, as with the prior art patents discussed in the background of the invention section. Instead, it is the protocol language itself, and is specific to each different instance of Test IP. And it is consistent with the language used in pre-silicon simulation.

3) The present invention is not just for digital instruments. As shown in some of the use cases, the present invention supports all types of digital, DC. AC, and RF protocols as well as being enabled by the signal conditioning (DACs, ADCs, RF, etc.)

Software of the present invention may run on a computer, a server, a tablet, a cell phone, or other smart device, so a description of such an accessorized exemplary computer system is hereinafter disclosed, even though a particular embodiment may not require all of the described components. Exemplary computer system 200 is shown schematically in FIG. 11, and which may comprise computing unit 201 interacting with external peripherals 202, such as a separate touch screen display 244, and interacting with network resources 203, including use of the internet 261, and other computers, which may be first and second laptop computers 262/263, a tablet, a smart phone etc.

The computing unit 201 may include a data bus 224 for communicating information across and among various parts of computing unit 201, and a central processing unit, which may be a microprocessor (hereinafter "processor" or "CPU") 222 coupled with a bus 224 for processing information and performing other computational and control tasks. Computing unit 201 may also include a volatile storage 225, such as a random access memory (RAM) or other dynamic storage device, coupled to bus 224 for storing various information as well as instructions to be executed by processor 222. The RAM may be Dynamic Random Access Memory (DRAM), or Static RAM (SRAM), or any other similar type of RAM known in the art. The volatile storage 225 may also be used for storing temporary variables or other intermediate information during execution of instructions by processor 222. Computing unit 201 may further include a read only memory (ROM) or an erasable programmable memory (EPROM) 227 or other static storage device coupled to bus 224 for storing static information and instructions for processor 222, such as basic input-output system (BIOS), as well as various system configuration parameters. A persistent storage device or non-volatile memory 226, such as a magnetic disk, optical disk, or solid-state flash memory device may be provided and may be coupled to bus 224 for storing information and instructions.

Computing unit 201 may be coupled via bus 224 to an integral display 221, possibly a touch-screen display, for use in displaying information to a user. If desired, computing unit 201 may be coupled via bus 224 to an external display screen 244. An external input device 243 (e.g., a standard keyboard) may be coupled to bus 224 for communicating information and command selections to processor 222. A cursor control device 242, such as a mouse, a trackball, or cursor direction keys, may be used for communicating direction information and command selections to processor 222 and for controlling cursor movement on display 244. An external storage device 241 may be connected to the computing unit 201 via bus 224 to provide an extra or removable storage capacity for the computing unit 201, which may be used to facilitate exchange of data with other computer systems.

Some of the techniques herein may be performed by computing unit 201 in response to processor 222 executing one or more sequences of one or more instructions contained in the volatile memory 225. Execution of the sequences of instructions contained in a memory may cause processor 222 to perform the process steps described herein. In alternative embodiments, specific hard-wired digital circuitry may be used in place of, or in combination with, software instructions to implement the invention.

The term "computer-readable medium" as used herein refers to any medium that participates in providing instructions to processor 222 for execution. The computer-readable medium is just one example of a machine-readable medium, which may carry instructions for implementing any of the methods and/or techniques described herein. Various forms of computer readable media may be involved in carrying one or more sequences of one or more instructions to processor 222 for execution, including non-volatile media (storage device 226), and volatile media (storage device 225). Common forms of computer-readable media include, for example, a floppy disk, a hard disk, magnetic tape, or any other magnetic medium, a CD-ROM, any other optical medium, a RAM, a PROM, an EPROM, a flash drive, and a memory card.

The computing unit 201 may thus also include a communication interface, such as network interface card 223 coupled to the data bus 222. Communication interface 223 may provide a two-way data communication coupling to a network link that may be connected to a local network. For example, communication interface 223 may be an integrated services digital network (ISDN) card or a modem to provide a data communication connection to a corresponding type of telephone line, or it may be a local area network interface card (LAN NIC) to provide a data communication connection to a compatible LAN.

Network link 223 also typically provides data communication to other network resources. For example, the network link may provide a connection over the internet 261 to the world-wide-web. Thus, the computing unit 201 can access resources located anywhere using the Internet 261. Also, the computing unit 201 may also be accessed by other computers (e.g. 262-263), generally with permission, and which may be located anywhere with access to the internet 261.

The examples and descriptions provided merely illustrate a preferred embodiment of the present invention. Those skilled in the art and having the benefit of the present disclosure will appreciate that further embodiments may be implemented with various changes within the scope of the present invention. Other modifications, substitutions, omissions and changes may be made in the design, size, materials used or proportions, operating conditions, assembly sequence, or arrangement or positioning of elements and members of the preferred embodiment without departing from the spirit of this invention.

We claim:

1. A reconfigurable test system configured to seamlessly integrate automated testing of semiconductor devices between a pre-silicon simulation test phase, a post-silicon validation test phase, and a production test phase, in one embodiment of software and hardware across all three of the test phases, for different devices, said reconfigurable test system comprising:

a tester instrument connected to a plurality of pins of a semiconductor device under test (DUT), said tester instrument comprising one or more FPGAs, for use in the three phases of testing;

multiple instances of Instrument IP (IIP) matched to each of one or more specific interfaces of a given DUT to provide functional and performance validation, characterization, and production test capabilities;

a computer system configured with a user interface and comprising a data bus, said computer system comprising a controller, and configured to have said controller connected to said tester instrument via said data bus;

a test program stored on said controller, said test program and controller configured, when said program is executed, to instantiate said multiple instances of IIP into said reconfigurable tester instrument, being matched to device interfaces for each different DUT, and configured to execute a sequence of tests utilizing the IIP;

an external memory;

a protocol engine, said protocol engine configured to maintain an interface protocol to and from the DUT;

a transaction processor, said transaction processor configured to take transactions from either said external memory or from a software executive, and process and send said transactions to said protocol engine; said transaction processor further configured to synchronize usage events by said multiple instances of Instrument IP, and configured to log events to save time-stamped transactions including pin-level detail into and out of the DUT, for each pin of the semiconductor DUT, and to store a log of the time-stamped transactions in said external memory;

wherein said tester instrument comprises one or more interface circuits configured to compare said time-stamped transactions out of said pins to an expected response; and a graphical user interface debug tool configured to graphically display the stored time-stamped pin-level transactions for each pin of the semiconductor DUT, both into and out of the DUT, to help debug test cases and DUT errors, and said debug tool further configured to graphically display said transactions into and out of the DUT in a scoreboard format.

2. The reconfigurable test system according to claim 1 wherein said tester instrument is connected to the DUT using one or more of the following connections:
- a digital pin electronic circuit;
- a signal conditioning circuit;
- an analog-to-digital convertor;
- a digital-to-analog convertor; and
- a load board.

3. The reconfigurable test system according to claim 2 wherein a test layer and a scenario layer are configured to communicate with said tester instrument using an SCE-MI interface, to provide seamless integration between the pre-silicon simulation test phase and the post-silicon validation test phase, and wherein a test code used for stimulus and response checking of the DUT is thereby usable for both the pre-silicon simulation test phase and the post-silicon validation test phase.

4. The reconfigurable test system according to claim 3 wherein said multiple instances of instrument IP comprises native-random stimulus generation and response checking.

5. The reconfigurable test system according to claim 4 wherein said multiple instances of instrument IP comprises a combination of random and pre-defined stimuli, and random and pre-defined response checking natively defined for each said multiple instances of instrument IIP for all DUT interfaces.

6. The reconfigurable test system according to claim 5 wherein said tester instrument is implemented as a monolithic integrated circuit.

7. The reconfigurable test system according to claim 5 wherein said tester instrument is implemented as a multi-chip module.

* * * * *